July 30, 1974 HAJIME SAWAZAKI ET AL 3,826,699

METHOD FOR MANUFACTURING A SEMICONDUCTOR INTEGRATED CIRCUIT ISOLATED THROUGH DIELECTRIC MATERIAL

Filed May 9, 1973 2 Sheets-Sheet 1

United States Patent Office 3,826,699 Patented July 30, 1974

3,826,699
METHOD FOR MANUFACTURING A SEMICONDUCTOR INTEGRATED CIRCUIT ISOLATED THROUGH DIELECTRIC MATERIAL

Hajime Sawazaki, Tokyo, Kiyohide Sakai, Yokohama, Hiroshi Tsutsumi, Fujisawa, Yasusuke Sumitomo and Kazuo Niwa, Yokohama, and Eisaku Inaba, Kitakyushu, Japan, assignors to Tokyo Shibaura Electric Co., Ltd., Kawasaki-shi, Japan Filed May 9, 1973, Ser. No. 358,701
Claims priority, application Japan, May 13, 1972, 47/47,382
Int. Cl. H01l 7/36, 7/50, 19/00
U.S. Cl. 148—175 6 Claims

ABSTRACT OF THE DISCLOSURE

A method for manufacturing a semiconductor integrated circuit comprises steps of forming an enclosed groove in the surface of a semiconductor wafer, forming an inner dielectric layer on the surface of the groove, depositing an epitaxial layer on said surface of the wafer and the surface of the dielectric layer, forming an outer dielectric layer on the epitaxial layer, forming a support substrate on the outer dielectric layer, removing the wafer in a predetermined level to form an island region enclosed by the outer dielectric layer and forming a semiconductor element in the island region.

This invention relates to a method for manufacturing a semiconductor integrated circuit whose island regions are electrically isolated through a dielectric layer.

Conventionally known is a semiconductor integrated circuit in which an electrical insulation is made between semiconductor elements using a dielectric layer. The integrated circuit consists of a semiconductor polycrystal layer, a plurality of semiconductor elements arranged at a predetermined interval on one side of the polycrystal layer, and a dielectric layer or insulator separation layer formed in a manner to insulate the semiconductor element from the polycrystal layer. The semiconductor element, if it is a transistor, consists of a collector region surrounded with a dielectric layer, a base region formed in the collector region, and an emitter region formed in the base region. Such a transistor has a planar structure in which the ends of PN junctions between the respective regions i.e. an emitter-base junction and base-collector junction are exposed in the same surface.

With such planar-type transistor, it is disadvantageously impossible to attain a high withstand voltage as is well known in the art. Likewise, if a semiconductor element is a diode of planar-type, it is also impossible to obtain a high withstand voltage.

For these reasons, the conventional semiconductor integrated circuit having such planar-type transistor or diode is very unsuitable for a high electric power purpose.

The present applicants filed on the same day as the present application an application Ser. No. 358,701 with the claims directed to an improved semiconductor integrated circuit overcoming the above disadvantages of the prior art device.

An object of this invention is to provide a method capable of easily manufacturing the above improved semiconductor integrated circuit.

SUMMARY OF THE INVENTION

In an aspect of this invention a method for manufacturing a semiconductor integrated circuit comprises the steps of forming a protective film on one side of a semiconductor wafer; removing predetermined portions of the protective film to expose the corresponding portions of the semiconductor wafer; etching the wafer down to a predetermined depth through the exposed portions thereof to form enclosed grooves; forming an inner dielectric layer on the surface of the groove; removing the remaining protective layer to expose the corresponding surface portion of the wafer; forming a vapour-grown semiconductor layer on the exposed surface of the wafer and on the surface of the inner dielectric layer in a manner to correspond in shape to the groove of the wafer; forming an outer dielectric layer on the surface of the vapour-grown semiconductor layer; forming a support substrate on the dielectric layer; removing the resulting assembly in a predetermined level to form an island region having the portion of the vapour-grown layer and the upper portion of the wafer, insulated through the outer dielectric layer from the support substrate and including the portion of the inner dielectric layer; and forming at least one semiconductor element in the island region.

This invention will now be explained in reference to the accompanying drawings, in which.

There will now be explained a semiconductor integrated circuit according to one embodiment of this invention with reference to FIG. 1.

Figure 1:
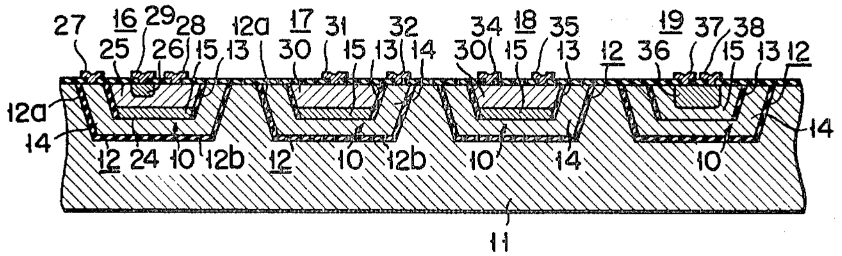
FIG. 1 is a view in cross section showing a semiconductor integrated circuit according to this invention.

In FIG. 1, reference numeral 11 is a layer or support substrate made of a polycrystalline silicon. On the upper portion of the support substrate are provided at a predetermined interval a plurality of island regions 10. Each of the island regions 10 is surrounded with an enclosed outer dielectric or insulator layer 12 made of silicon dioxide except for the exposed top surface thereof, resulting the island region being electrically insulated from the substrate 11.

The insulator layer 12 consists of a peripheral side portions 12*a* abutted against the peripheral side surfaces of the island region and a bottom portion 12*b* in contact with the bottom surface of the island region. The peripheral side surfaces 12*a* are inclined in a manner that the rectangular cross section of the island region 10 is decreased toward the inside of the substrate 11. Within the island region 10 surrounded with the dish-like dielectric layer 12 is provided an inner dielectric layer 13 made of silicon dioxide. The dielectric layer 13 assumes a bottomless plate shape and is arranged parallel to, and at a predetermined interval from, the peripheral side portions 12*a* of the first or outer dielectric layer 12. That portion 14 of the island region 10 situated between the dielectric layers 12 and 13 is made of polycrystal silicon. That portion 15 surrounded with the second dielectric layer 13 is made of monocrystal silicon. Within the island regions 10 semiconductor elements 16, 17, 18 and 19 are respectively provided. With this embodiment the first semiconductor element 16 is a transistor. The transistor includes an emitter-base junction having, like a conventional planar transistor, an exposed end at the upper surface of the element and a flattened collector-base junction, substantially parallel to the substrate surface, whose peripheral end is embedded in the island region and situated at the lower end of the second dielectric layer. By these junctions, a collector region 24 of N-conductivity type, a base region 25 of P-conductivity type and an emitter region 26 of N-conductivity type are defined. In the portion 14 of the collector region 24 impurities are uniformly doped in high concentration so that the portion 14 is lower in resistance than the portion 15 of the collector region 24. The base region 25 is formed to be greater in impurity concentration than the portion 15 of the collector region. On the collector region 24, base region 25 and emitter region 26 are mounted a collector electrode 27, base electrode 28 and emitter electrode 29, respectively. As the inner dielectric layer 13 is inwardly inclined in a central direction, this inclination affords what is called "a positive bevel" relative to the base-collector junction, thereby enhancing a reverse withstand voltage characteristic.

The second semiconductor element 17 is a diode having a P-N junction horizontally formed in the portion 15 surrounded with the second dielectric layer 13 of the island region 10. An anode region 30 of P-conductivity type is located on one side of the P-N junction, and a cathode region of N-conductivity type consists of the region on the other side of the P-N junction and the outer region 14. On the anode region and cathode region are mounted an anode electrode 31 and cathode electrode 32, respectively.

The third semiconductor element 18 is, like the second semiconductor element 17, a diode structure and its anode region 30 is used as a resistor. On the region 30 two electrodes 34 and 35 are mounted in a spaced-apart relationship.

The fourth semiconductor element 19 has a region 36 formed by selective diffusion at the center of the inside portion 15 of the island region, the region 36 being used as a resistor. On the region 36 are mounted in a spaced-apart relationship two electrodes 37 and 38.

Explanation is now made, upon reference to FIGS. 2A to 2D, of a method for manufacturing a semiconductor integrated circuit of the above construction.

Use is made of a silicon wafer 20 whose top surface is oriented to a (100) face and whose specific resistance is below 0.015 Ωcm. The wafer 20 has on the top surface a layer 20*a* of N-conductivity type having a resistivity of 2–3 Ωcm. and a thickness of 20μ which is epitaxially grown using a known epitaxial vapour growth method. On the top surface of the epitaxially grown layer 20*a* a silicon nitride film is formed. The film is bored at its predetermined portions to expose the corresponding portions of the top surface of the layer 20*a* by a photoetching technique so as to provide a protective mask 21. Then, a selective etching is made, using hydrazine, over an area extending from that portion of the epitaxially grown layer 20*a* exposed by the photoetching process down to a predetermined depth of the wafer 20. Since in this case use is made of hydrazine as an etchant and of a wafer whose top surface is oriented to a (100) face, the wafer is not etched in a direction of a (111) face, is somewhat etched in a direction of a (110) face and is most etched in the direction of the (100) face. As a result, enclosed grooves 22 provided by etching are V-shaped in cross section in which the (111) face constitutes the inclined surface of the groove. That is, the etching progresses principally in a depth direction, not in a width direction, resulting in a predetermined inclined angle of the V-shaped groove. When the etching progresses down to the apex of the V-shaped groove, no further etching occurs. Since the depth of etching of the wafer is determined by the dimension of the mask hole, it will be easily understood that a depth control can be effected with ease.

Thereafter, the substrate as a whole is oxidized at a high temperature to form a silicon dioxide film 13, as an inner dielectric layer, on the exposed surface of the groove 22. Since the silicon nitride film covered over the top surface of the epitaxially grown layer 20*a* is impervious to oxygen, no silicon dioxide film is formed during the high temperature oxidation process on the silicon nitride film. The wafer is treated, by phosphoric oxide heated to 180° C., to remove the silicon nitride mask, thereby exposing the surface of the epitaxially grown layer 20*a*. In this case, the selective etching of the mask 21 is effected, without using any other particular mask, by an etchant adapted to etch away silicon nitride only with silicon dioxide left unetched. Silicon is vapour-grown on the exposed top surface 23 and on the silicon dioxide layer 13 to form a grown layer 14. It is preferred that during this vapour-growth period an impurity of N-conductivity type be doped in greater amount so as to enhance the impurity concentration, preferably of the order of $10^{20}$ atoms/cc., of the grown layer 14. It will be easily appreciated that the vapour-grown layer 14 is formed in a manner that monocrystal silicon is grown on the top surface 23 of the epitaxial layer and a polycrystal silicon is grown on the upper surface of the silicon dioxide layer 13. Alternately the grown layer 14 may be only made of a polycrystal silicon in a suitable manner. On the surface of the layer 14 so vapour-grown is formed an insulating or dielectric layer 12 made of silicon dioxide or silicon nitride. From FIG. 2B it will be appreciated that a groove is formed in the vapour-grown layer 14 and dielectric layer 12 in a manner to correspond to the V-shaped groove 22 of the wafer.

Figure 2A:
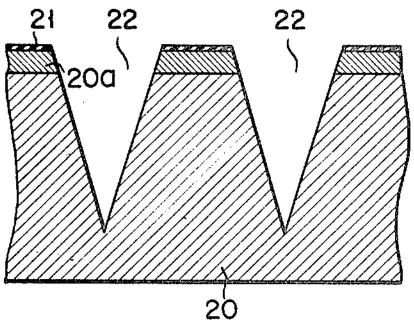
FIGS. 2A to 2D are process views for explaining a method for manufacturing a semiconductor integrated circuit shown in FIG. 1 according to one embodiment of this invention.
Figure 2B:
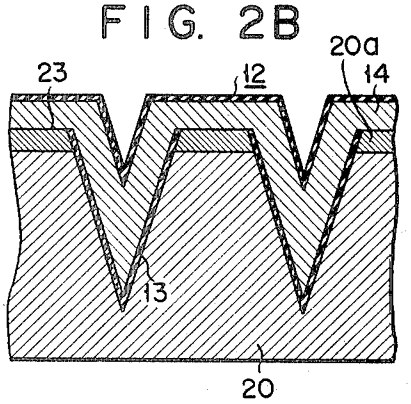
Figures 2C, 2D:
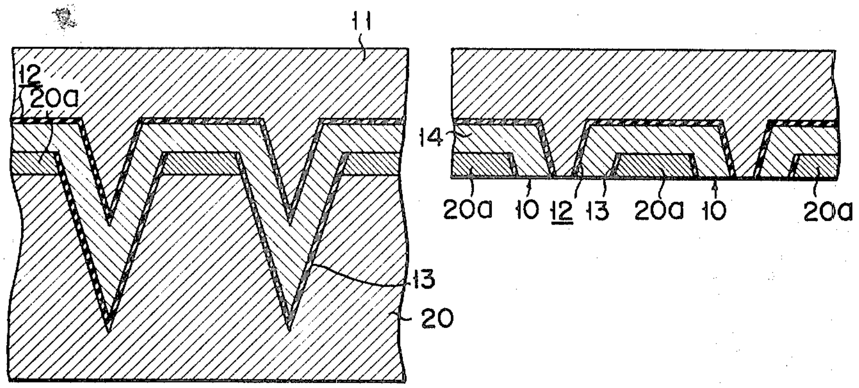

As shown in FIG. 2C, a silicon polycrystal layer 11 is later formed, as a support substrate, on the silicon dioxide layer 12 using a vapour-growth method.

Then, the wafer 20 is, as shown in FIG. 2D, removed from below using an etching method. In this case use may be made of an etchant adapted to selectively etch away for example only silicon of low resistance with silicon dioxide left almost unetched. Through this etchant treatment, a silicon dioxide layer 13 formed inside of the V-shaped groove 22 and a vapour grown layer 14 covered over the layer 13 are left in a projecting manner, and the projecting portion thereof can be later removed by lapping and polishing. During the polishing operation a pressure load is applied only on the projecting portion of the layers 13 and 14 and the flattened portion of the epitaxial layer 20*a* acts as a stop for polishing operation. Thus, only the projecting portion thereof can be accurately removed.

In this way, a basic structure of a dielectric separation type semiconductor integrated circuit is formed. A desired semiconductor element such as transistor and diode is formed, using a conventional semiconductor technique such as a selective diffusion method, in the island region 10 consisting of the vapour-grown layers 14 and 20*a* surrounded with the insulating layer 12, thereby obtaining a device as shown in FIG. 2.

With the device so constructed, when the thickness of the epitaxial layer 20*a* surrounded with the second dielectric layer is 20μ and the thickness of the vapour-grown layer 14 is 33μ, then the surface of the polycrystal portion is 41μ in width. The dimension to this extent is just convenient for electrode mounting.

The first semiconductor element 16 of the device as shown in FIG. 1 is a transistor whose base region 25 is 5μ in depth. Since the base region is formed by diffusing impurities over the whole surface of the epitaxial layer 20*a* surrounded with the dielectric layer, the base-collector junction formed between the base region 25 and the collector region 24 is parallel to the top surface of the epitaxial layer 20*a*, and its peripheral edge is protected by the dielectric layer 13 without exposure to the top surface of the layer 20*a*. For this reason, the withstand voltage of the junction amounts to 200 v. in comparison with 100 v. in the case of a conventional planar structure.

Since that peripheral portion of the base-collector junction conductive to the withstand voltage is not exposed to the element surface, no influence is given to that peripheral portion thereof, even if impurities are introduced through the pinholes of the mask into the element during the emitter formation period. Thus, a drop in withstand voltage due to this cause will not take place.

In a case where impurities are preliminariy doped in high concentration, as in the above embodiment, into the vapour-grown layer 14, no mask is necessary when an impurity diffusion is made for the formation of the base region 25, anode or cathode region 30. Furthermore, cumbersome photoetching steps involved are less in number than those involved in the prior art.

Figure 3:
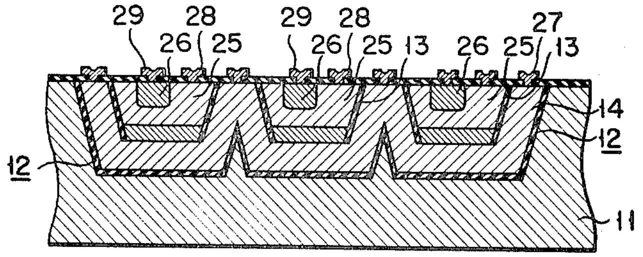
FIGS. 3 to 5 are views in cross section showing various semiconductor integrated circuits according to this invention.

Another device shown in FIG. 3 is for the purpose of obtaining a high power transistor. Within an outside dielectric layer 12 in a polycrystal silicon substrate 11 are formed three bottomless inside dielectric layers 13. A vapour-grown layer 14 having a high impurity concentration is formed between the dielectric layers 12 and 13. Within a silicon monocrystal surrounded with the dielectric layer 13, a base region 25 and an emitter region 26 are respectively formed using a conventional impurity diffusion method. An emiter electrode 29 is mounted on each emiter region 26 and a base electrode 28 is mounted on each base region 25. On the collector region 14 a plurality of collector electrodes 27 are provided outside of the inside dielectric layer 13.

Figure 4:
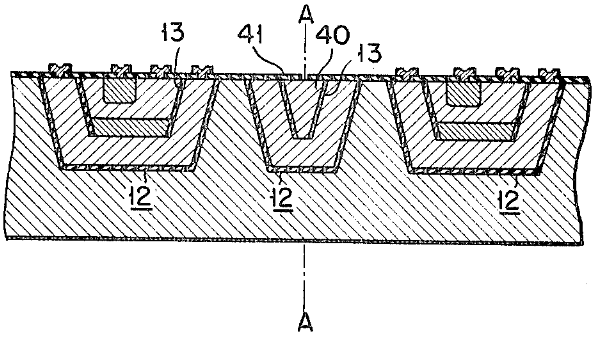

A device shown in FIG. 4 has a structure very convenient when it is diced along a dotted line A—A. That is, preliminarily removed for ease in dicing is part of a silicon dioxide film 41 corresponding to the top surface of a silicon monocrystal region 40 situated within bottomless inside dielectric layer 13 in the outside dielectric layer.

Figure 5:
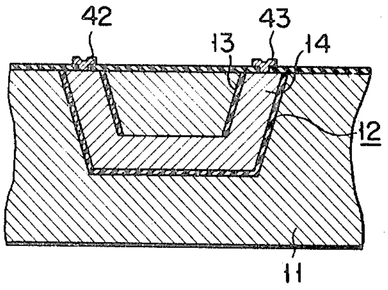

A semiconductor element of a device shown in FIG. 5 includes as resistors, an outside dielectric layer 12 formed within a silicon polycrystal substrate 11 and a vapour-grown layer 14 situated between the outside dielectric layer 12 and an inside dielectric layer 13. On the top surface of the layer 14 a pair of electrodes 42, 43 are mounted on both sides of the inside dielectric layer 13.

What we claim is:

1. A method for manufacturing a semiconductor integrated circuit comprising the steps of forming a protective film on one main surface of a semiconductor wafer said semiconductor wafer having said main surface and an opposing surface; removing predetermined portions of the protective film to expose the corresponding portions of the semiconductor wafer; etching the wafer down to a predetermined depth through the exposed portions thereof to form enclosed grooves in the wafer; forming an inner dielectric layer on the surface of the groove; removing the remaining protective layer to expose the corresponding surface portion of the wafer; forming a vapour-grown semiconductor layer on the exposed surface of the wafer and on the surface of the inner dielectric layer in a manner to correspond in shape to the groove in the wafer; forming an outer dielectric layer on the surface of the vapour-grown semiconductor layer; forming a support substrate of polycrystalline material on the outer dielectric layer; removing semiconductor material from said opposing surface to a predetermined level to form an island region including the portion of the vapour-grown layer and the upper portion of the original wafer, insulated through the outer dielectric layer from the support substrate and including the portion of the inner dielectric layer insulating the sidewalls of said portion of the original wafer from said vapour-grown layer portion; and forming at least one semiconductor element in the island region by conventional diffusion.

2. A method for manufacturing a semiconductor integrated circuit according to claim 1, in which said semiconductor element forming step further includes a step for diffusing an impurity into the wafer portion surrounded with the inner dielectric layer to form a region of opposite conductivity type to that of the wafer in a manner to define a PN junction situated in parallel to the surface of the wafer and having a periphery abutted against the inner surface of the inner dielectric layer.

3. A method for manufacturing a semiconductor integrated circuit according to claim 2, in which said semiconductor element forming step further includes a step of selectively diffusing an impurity at the center portion of said region to form a region of the same conductivity type as that of the wafer.

4. A method for manufacturing a semiconductor integrated circuit according to claim 1, in which said groove forming step includes forming a groove which is V-shaped in cross section.

5. A method for manufacturing a semiconductor integrated circuit according to claim 4, in which said wafer is a silicon wafer whose one surface is oriented to a (100) face; and said groove forming step includes etching for a predetermined period with hydrazine the wafer surface portion exposed through the hole formed in the protective layer which is provided on one surface of the wafer.

6. A method for manufacturing a semiconductor integrated circuit according to claim 1, in which said vapour-grown semiconductor layer is grown so as to have a relatively high impurity concentration.

References Cited

UNITED STATES PATENTS

| | | | |
|---|---|---|---|
| 3,440,498 | 4/1969 | Mitchell | 317—234 |
| 3,624,463 | 11/1971 | Davidsohn | 317—234 |
| 3,689,992 | 9/1972 | Schutze et al. | 29—580 X |
| 3,716,425 | 2/1973 | Davidsohn | 148—175 |
| 3,721,588 | 3/1973 | Hays | 148—175 |
| 3,738,877 | 6/1973 | Davidsohn | 148—175 |

L. DEWAYNE RUTLEDGE, Primary Examiner
W. G. SABA, Assistant Examiner

U.S. Cl. X.R.

29—578, 580; 117—201, 212, 215; 317—235 R